(12) United States Patent
Crook et al.

(10) Patent No.: US 10,309,014 B2
(45) Date of Patent: Jun. 4, 2019

(54) METHOD OF CLEANING A PLASMA PROCESSING DEVICE

(71) Applicant: SPTS TECHNOLOGIES LIMITED, Newport (GB)

(72) Inventors: Kathrine Crook, Wotton-Under-Edge (GB); Mark Carruthers, Newport Gwent (GB); Andrew Price, Gwent (GB)

(73) Assignee: SPTS Technologies Limited, Newport (GB)

( * ) Notice: Subject to any disclaimer, the term of this patent is extended or adjusted under 35 U.S.C. 154(b) by 0 days.

(21) Appl. No.: 15/590,063

(22) Filed: May 9, 2017

(65) Prior Publication Data
US 2017/0342556 A1 Nov. 30, 2017

(30) Foreign Application Priority Data
May 24, 2016 (GB) .................................. 1609119.1

(51) Int. Cl.
| | |
|---|---|
| *C23C 16/44* | (2006.01) |
| *C23C 16/452* | (2006.01) |
| *C23C 16/52* | (2006.01) |
| *B08B 7/00* | (2006.01) |
| *H01J 37/32* | (2006.01) |

(52) U.S. Cl.
CPC ........ *C23C 16/4405* (2013.01); *B08B 7/0035* (2013.01); *C23C 16/452* (2013.01); *C23C 16/52* (2013.01); *H01J 37/32357* (2013.01); *H01J 37/32862* (2013.01); *H01J 37/32963* (2013.01); *H01J 2237/335* (2013.01)

(58) Field of Classification Search
None
See application file for complete search history.

(56) References Cited

U.S. PATENT DOCUMENTS

| | | | |
|---|---|---|---|
| 6,079,426 A | 6/2000 | Subrahmanyam et al. | |
| 6,543,459 B1 | 4/2003 | Annapragada | |
| 7,354,778 B2 | 4/2008 | Heger | |
| 2004/0087170 A1 | 5/2004 | Heger et al. | |
| 2004/0253828 A1* | 12/2004 | Ozawa ................ | C23C 16/4405 438/710 |
| 2006/0090773 A1 | 5/2006 | Choi et al. | |

(Continued)

FOREIGN PATENT DOCUMENTS

JP 2002151417 A 5/2002

OTHER PUBLICATIONS http://www.mksinst.com/docs/UR/ProcessSenseDS.pdf.

*Primary Examiner* — Nicole Blan
(74) *Attorney, Agent, or Firm* — Volentine, Whitt & Francos, PLLC

(57) ABSTRACT

A method of cleaning a chamber of a plasma processing device with radicals includes creating a plasma within a remote plasma source which is separated from the chamber, the plasma including radicals and ions, cleaning the chamber by allowing radicals to enter the chamber from the remote plasma source while preventing the majority of the ions created in the remote plasma source from entering the chamber, detecting a DC bias developed on a component of the chamber during cleaning; and using the detected DC bias to determine an end-point of the cleaning and, on determination of the end-point, to stop the cleaning.

21 Claims, 3 Drawing Sheets

(56) References Cited

U.S. PATENT DOCUMENTS

2009/0035945 A1* 2/2009 Fujii .................. C23C 16/4405
438/758
2014/0053867 A1* 2/2014 Fang ................. H01J 37/32357
134/1.1

* cited by examiner

METHOD OF CLEANING A PLASMA PROCESSING DEVICE

BACKGROUND

This invention relates to a method of cleaning a plasma processing device of the type having a remote plasma source for generating radicals which are used to perform the cleaning. The invention relates also to associated plasma processing devices.

In the manufacture of semiconductor products, PECVD (plasma enhanced chemical vapour deposition) deposition of dielectric materials is required for isolation and passivation purposes. These processes can be used in applications which range from front-end device to back-end Through Silicon Via (TSV), via reveal and interposer manufacture. Regular cleaning of the PECVD process chamber is required between wafer processing operations to prevent the creation and accumulation of contaminant particles. These contaminant particles affect the performance and reliability of the deposited dielectric films, resulting in low wafer yield and premature device failure. Two techniques are commonly used for cleaning. These techniques are direct plasma cleaning and remote plasma source (RPS) cleaning.

Direct plasma cleaning involves the creation of a plasma in the process chamber itself for cleaning purposes. Direct plasma cleaning of silicon based dielectric films such as silicon dioxide and silicon nitride typically involves the detection of an optical end-point signal to determine when to stop the cleaning process. This is achieved by monitoring plasma intensity in the chamber by detecting suitable emissions, such as emission from ionised fluorine. U.S. Pat. No. 7,354,778 discloses end-point detection in a direct plasma cleaning process in which a DC bias voltage of the plasma generator is monitored. Because the plasma generator is part of the direct plasma cleaning arrangement, the cleaning is performed using ionised process gases created in the chamber itself. Accordingly, the concentration of charged particles which would be expected to give rise to the DC bias voltage in the chamber is relatively high.

An RPS cleaning system does not produce plasma inside the PECVD chamber, and so it is not possible to detect an optical end-point signal in the chamber, as there is no plasma in the chamber to produce an optical output. Additionally, there is no direct source of charged particles within the PECVD process chamber, which will be anticipated to dramatically reduce the concentration of charged particles available to produce a DC bias signal of the type detected in U.S. Pat. No. 7,354,778.

In contrast, an advantage associated with many RPS cleaning methodologies is that cleaning is performed primarily using radical species. The decoupling of the remote plasma source from the PECVD chamber in which cleaning takes place results in the majority of the charged species created by the cleaning plasma being prevented from entering the PECVD chamber. The consequent reduction of ion bombardment in the PECVD chamber has the advantage of resulting in less wear on chamber components. This has the consequential advantage of reducing the frequency of chamber interventions for maintenance purposes.

U.S. Pat. Nos. 6,079,426, 6,543,459, and US2006/0090773 describe the detection of cleaning end-points for RPS devices. U.S. Pat. No. 6,079,426 and US2006/0090773 disclose the detection of a cleaning end-point by monitoring chamber pressure. U.S. Pat. No. 6,543,459 discloses a method of determining a cleaning end-point for a remote microwave plasma cleaning system in which capacitance changes are monitored. Another end-point detection technique uses infrared detection of a cleaning end-point. The measurements are made in the vacuum exhaust line downstream of the process chamber. This technique has been commercialised as the Process Sense® end-point sensor by MKS Instruments, Inc. of Methuen, Mass. 01844, USA.

SUMMARY

The present invention, in at least some of its embodiments, provides an improved method of detecting a cleaning end-point in a RPS cleaning device which does not require the use of specialist, additional detectors such as optical or infra-red detectors. Although the invention is particularly suited to the cleaning of PECVD devices, the invention can be used in conjunction with the cleaning of other processing devices as well.

According to a first aspect of the invention there is provided a method of cleaning a chamber of a plasma processing device with radicals comprising the steps of:

creating a plasma within a remote plasma source which is separated from the chamber, the plasma comprising radicals and ions;

cleaning the chamber by allowing radicals to enter the chamber from the remote plasma source while preventing the majority of the ions created in the remote plasma source from entering the chamber;

detecting a DC bias developed on a component of the chamber during cleaning; and using the detected DC bias to determine an end-point of the cleaning and, on determination of the end-point, to stop the cleaning.

For the avoidance of doubt the term 'radicals' is intended to refer to uncharged reactive species having one or more unpaired electrons. The radicals may be atomic or molecular. The term "component of the process chamber" is used to refer to certain components used during the course of plasma processing of a substrate or workpiece and apart from those used exclusively for the cleaning of the process chamber. The term "process section" of the device is intended to refer to the entire portion of the device constituted by the structural components which those skilled in the art would understand as directly associated with the process chamber and more or less delimiting the process space in which the plasma processing of a wafer or other workpiece takes place in the device. The process section thus includes, for example, the main body (walls) of the process chamber delimiting the process space in which the plasma processing directly takes place, the walls of the process chamber defining a pumping gallery through which gas is exhausted from the process space, a gas inlet system for introducing source gas for the plasma process into the process space, and a substrate support disposed in the process chamber. Thus, the process chamber (or gas inlet system when forming part of the process chamber) may constitute one end of the process section and the pumping gallery may constitute the other end of the process section.

Very surprisingly, it has been found that a measurable and useful DC bias signal can be developed on a component of the process chamber even though charged particles are not produced in the process chamber during the cleaning process. Ions and electrons are produced during cleaning in the remote plasma source. However, these species are short-lived and the majority of them do not reach the process chamber. In fact, it is expected that substantially all (95% or more) of the electrons and ions created in the remote plasma source do not reach the process chamber. Accordingly, it is very surprising that a measurable and useful DC bias signal can be developed on a component of the process chamber. The DC bias signal is easy to measure and does not require the use of specialist, additional detectors such as optical or infra-red detectors. An additional benefit is that detection takes place directly in the process chamber in which the cleaning takes place.

The component may be a component of a gas inlet system. The component may act as a conduit for radicals produced in the remote plasma source. In one embodiment, the component is a showerhead. As is well known to the skilled reader, a showerhead is a gas supply element having a plurality of perforations or other apertures. The perforations or other apertures allow gas to be introduced evenly into the process chamber 12. Typically, the showerhead comprises a first plate having a gas inlet and a second plate which carries the perforations or other apertures. The first and second plates are spaced apart to define a cavity.

Alternatively, the component may be a substrate support. The substrate support may be a platen. Alternatively still, the component may be an electrically isolated portion of a wall of the chamber, or a pumping gallery. A pumping gallery may be a conduit for exhausting gases which is defined by one or more walls of the chamber.

Generally, the component is formed from an electrically conductive material such as a metal. The metal may be aluminium.

The plasma processing device may be a PECVD device.

The end-point may be determined by detecting that the DC bias has attained a steady-state.

The cleaning may be performed using F radicals. The plasma created within the remote plasma source may use $NF_3$ as a precursor.

The chamber may be cleaned after one or more dielectric films have been deposited in the chamber. The dielectric films may be films of a silicon containing dielectric material. The silicon containing dielectric material may be silicon dioxide or silicon nitride.

The cleaning may be performed after plasma processing of a semiconductor substrate. The semiconductor substrate may be a silicon substrate. The semiconductor substrate may be a semiconductor wafer, such as a silicon wafer.

The cleaning may be performed after an isolation or passivation plasma processing step.

The cleaning may be performed after a TSV, via reveal or interposer manufacture plasma processing step.

According to a second aspect of the invention there is provided a plasma processing device comprising;
 a chamber;
 a remote plasma source which is configured to, in use, create a plasma comprising radicals and ions;
 a connector which separates the remote plasma source from the chamber and which allows radicals to enter the chamber while prevent the majority of the ions created in the remote plasma source from entering chamber so that the chamber can undergo cleaning by radicals;
 a detector for detecting a DC bias developed on a component of the chamber during cleaning; and
 a controller which is configured to use the detected DC bias to determine an end-point of the cleaning and, on determination of the end-point, to stop the cleaning.

The connector may be electrically insulating. The connector may be formed from a dielectric material such as a ceramic.

The connector may comprise a plurality of gas conducting bores. The gas conducting bores may each have a diameter of less than 10 mm, preferably less than 5 mm. In this way, plasma generated in the remote plasma source is substantially prevented from reaching the chamber.

The connector may comprise a plug having the plurality of gas conducting bores formed therethrough.

The device may be a PECVD device.

The remote plasma source may be an inductively coupled plasma (ICP) source or any other suitable plasma source.

Whilst the invention is described above, it extends to any inventive combination of the features set out above or in the following description, drawings or claims. For example, any feature described in relation to the first aspect of the invention is also disclosed in combination with the second aspect of the invention and visa versa.

BRIEF DESCRIPTION OF THE DRAWINGS

Embodiments of methods and devices in accordance with the invention will now be described with reference to the accompanying drawings, in which:—

DETAILED DESCRIPTION OF EMBODIMENTS

Figure 1:
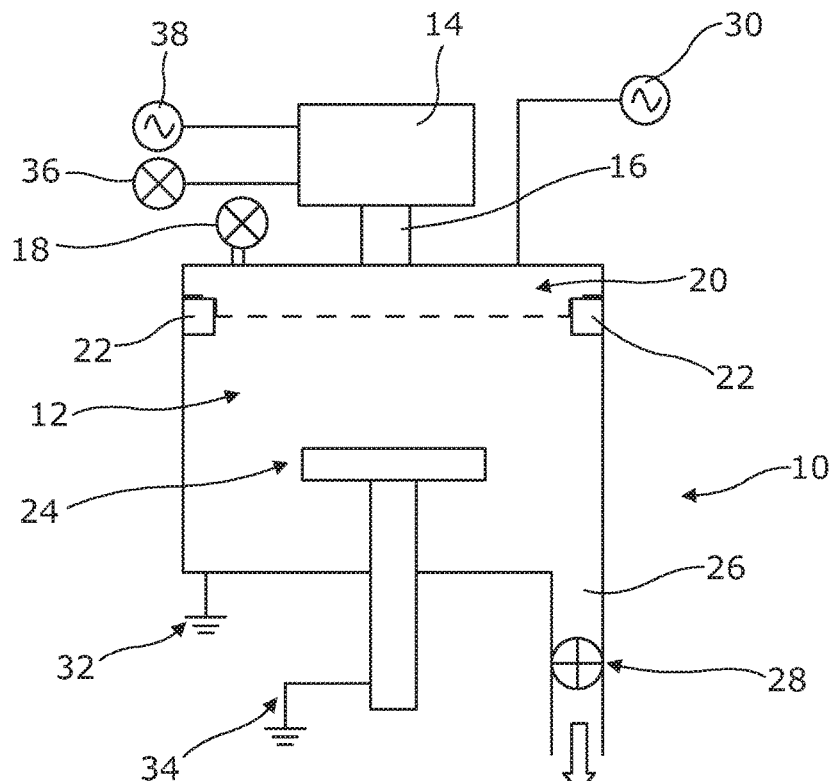
FIG. 1 shows a plasma processing device of the invention.

FIG. 1 shows a PECVD device, depicted generally at 10, of the invention. The PECVD device 10 is of the type comprising a process chamber 12 and a remote plasma source 14 which is positioned remotely from the process chamber 12. The remote plasma source 14 is connected to the process chamber 12 by an isolator 16 which has a gas feed through. A gas inlet system is provided which comprises a suitable gas supply system 18 for supplying one or more process gases to the process chamber 12. The gas inlet system further comprises a showerhead 20 which constitutes a top portion of the process chamber 12. As is well known to the skilled reader, the showerhead is a gas supply element having a plurality of perforations or other apertures which allow gas to be introduced evenly into the main body portion of the process chamber 12. Gases entering the showerhead 20 from the gas supply system form a gas reservoir in the interior volume of the showerhead 20 before passing through the perforations or other apertures into the main body of the process chamber 12. The showerhead is formed from electrically conductive material such as aluminium or another suitable metal. During plasma processing an RF electrical signal is applied to the showerhead 20 by an RF generator 30. The showerhead 20 is electrically isolated from the remainder of the process chamber 12 by a ceramic isolator 22. A platen 24 is located within the process chamber 12. A wafer or other workpiece to be processed is mounted on the platen 24. The device 10 further comprises an exhaust foreline 26 which is in connection with a suitable pump (not shown). As shown in FIG. 1 a FTIR monitoring system 28 is provided for monitoring cleaning by-products passing through the foreline 26. The FTIR monitoring system 28 has been included in the device 10 shown in FIG.

1 in order to provide comparative data to assess the performance of the invention. The FTIR monitoring system 28 does not form part of the present inventive concept and is not an essential element of the present invention. The process chamber 12 is earthed at a point 32 and the platen 24 is earthed at a point 34. The device 10 further comprises a suitable detector (not shown) for measuring a DC bias developed on the showerhead 20 during cleaning and a controller (not shown) for determining the end-point of a cleaning operation based on the measured DC bias. On determination of the end-point, the controller ends the cleaning operation. The controller can be a computer or another microprocessor based control device as is well known in the art. Typically, the controller also controls other operations of the PECVD device.

The remote plasma source 14 comprises a suitable plasma generation device to initiate and sustain a plasma in a gaseous atmosphere supplied by the remote plasma source gas supply system 36. The remote plasma source may be an inductively coupled plasma (ICP) source powered by an RF electrical supply 38. Other forms of plasma generator might be contemplated instead. The plasma created in the remote plasma source 14 comprises a mixture of energetic, excited particles including ions, electrons and neutral radical species. In the present invention, the cleaning of the process chamber 12 is primarily performed with radicals which are introduced into the process chamber 12 via the isolator 16. The isolator 16 electrically isolates the remote plasma source 14 from the showerhead 20 at the top of the process chamber 12. The isolator 16 comprises a ceramic member and a series of relatively small diameter holes formed in the ceramic such as by drilling. In one embodiment, a series of holes of approximately 3 mm diameter are formed in the isolator 16 to prevent the plasma generated in the remote plasma source 14 from reaching the back face of the showerhead 20. Radicals generated by the plasma produced in the remote plasma source 14 pass through the series of holes in the isolator 16 and enter the main body of the process chamber 12 through the showerhead 20. These radicals are used to clean the surfaces of the main body of the process chamber 12. For example, dielectric film deposited during the processing that takes place in the process chamber 12 is removed from the chamber surfaces by the radical cleaning. Because the process chamber 12 is substantially decoupled from the cleaning plasma in the remote plasma source 14, there is a substantial reduction in ion bombardment which results in less wear on the chamber components and consequently reduces the frequency of chamber intervention for maintenance purposes.

It has been observed that a DC bias is developed on certain components of the chamber 12 during the cleaning process. The DC bias has been observed to change as the dielectric film in the chamber is cleaned. It has been realised that the DC bias can indicate when the cleaning process is complete. In particular, a plateau or other steady-state condition in the DC bias can be indicative that the cleaning process is complete. It is very surprising that the DC bias in the chamber is observable and that it can be useful in determining a cleaning end-point. Without wishing to be bound by any particular theory or conjecture, it is believed that the DC bias observed on components of the chamber 12 is due to the presence of ions and electrons reaching the components and inducing a small positive or negative charge on the component. This is surprising given the relatively short lifetime of charged ions and electrons generated in the plasma which is induced in the remote plasma source 14 and the fact that the remote plasma source 14 is decoupled from the process chamber 12. It is particularly convenient to monitor the DC bias induced on the showerhead 20 during cleaning. It will be appreciated that during the ordinary operation of the device 10 to design prior to a cleaning operation, the showerhead is RF live. The RF is removed before cleaning commences, and during the cleaning process the showerhead 20 is electrically floating. Film thickness measurements from various parts of the chamber show that the showerhead 20 has the thickest deposits of dielectric film to be removed. This is due to the showerhead being RF live during plasma processing. It has been observed that once the showerhead 20 is clean, the rest of the chamber 12 is also clean. Therefore, measurement of the DC bias on the showerhead 20 is a particularly effective way of determining the true end-point of the cleaning operation.

Experiments were performed cleaning the PECVD device of FIG. 1 after the deposition of a range of dielectric films. Cleaning was performed by introducing $NF_3$ into the remote plasma source 14 and generating an inductively coupled plasma which ionises and dissociates $NF_3$ molecules. This results in the production of fluorine free radicals, some of which are in an excited state, together with anions, cations and electrons. The fluorine radicals are used to clean the process chamber 12.

Figure 2:
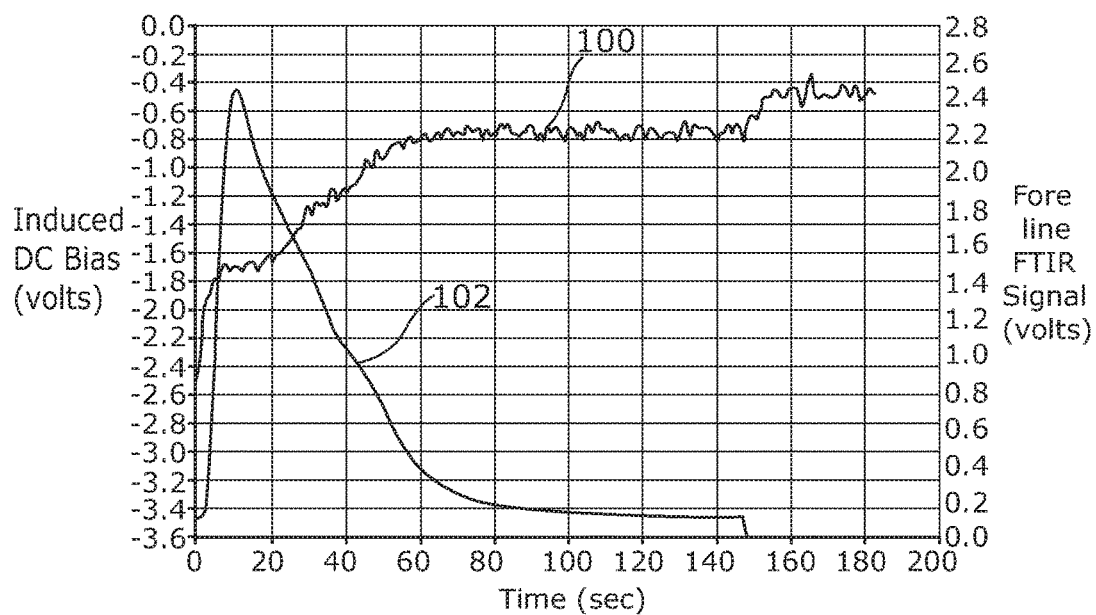
FIG. 2 shows DC bias and FTIR signal during cleaning following deposition of a 0.6 micron TEOS film at 125° C. (aluminium showerhead)
Figure 3:
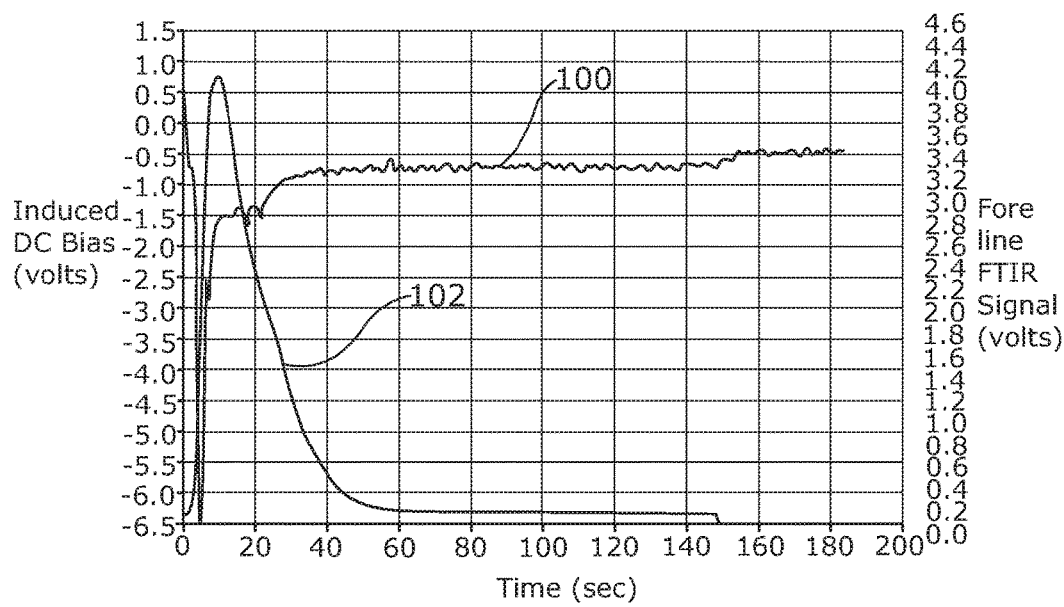
FIG. 3 shows DC bias and FTIR signal during cleaning following deposition of a 0.2 micron SiN film at 125° C. (aluminium showerhead)
Figure 4:
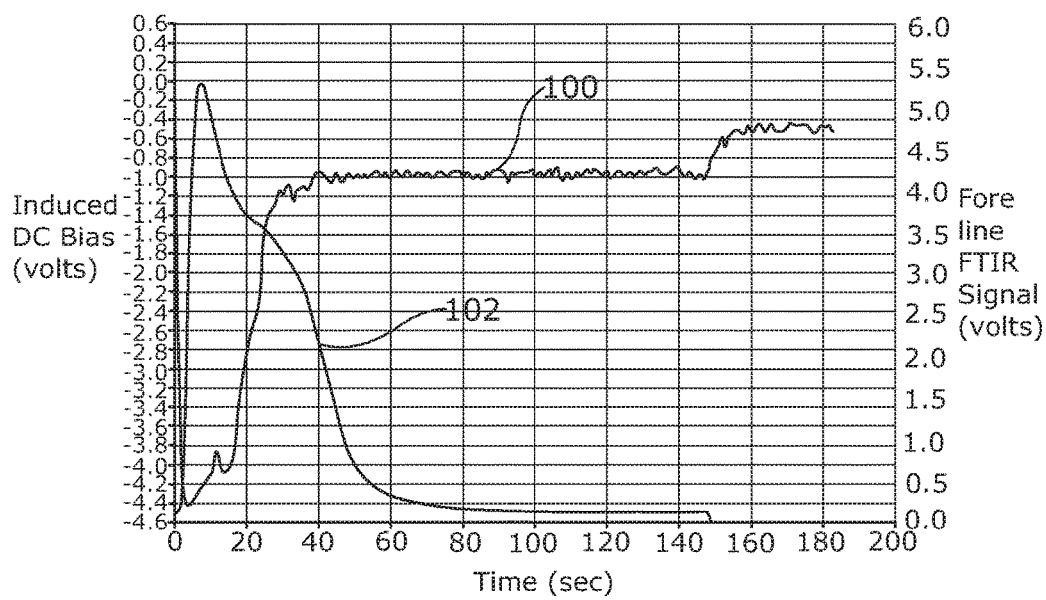
FIG. 4 shows DC bias and FTIR signal during cleaning following deposition of a 1.05 micron SiN/0.6 micron TEOS stack at 125° C. (anodised aluminium showerhead)

A PECVD device as shown in FIG. 1 was used to deposit a range of dielectric films onto silicon wafers. After deposition of a desired type of dielectric film, cleaning of the process chamber was performed. The cleaning process was monitored by detecting DC bias induced on the showerhead and FTIR signal obtained from cleaning by-products in the foreline. A range of films were deposited including silicon oxide, silicon nitrides and film stacks comprising layers of silicon nitride and silicon oxide. Silicon oxide films were deposited using different methodologies, namely known techniques using tetraethyl orthosilicate (TEOS) and silane as precursors. Films were produced with thicknesses ranging from 100 nm to 3.2 micron using deposition temperatures from 125° C. to 350° C. Aluminium and anodised aluminium showerheads were used. The results are summarised in Table 1. FIGS. 2, 3 and 4 show induced DC bias signal 100 and FTIR signal 102 obtained during cleaning after deposition of a number of films. More particularly, FIG. 2 relates to cleaning after deposition of a 0.6 micron silicon dioxide film at 125° C. using the TEOS method with an aluminium showerhead. Both DC bias 100 and FTIR 102 signals plateau at around 120 seconds, indicating that the chamber is clean. FIG. 3 relates to cleaning after deposition of a 0.2 micron silicon nitride film deposited at 125° C. with an aluminium showerhead. DC bias 100 and FTIR 102 signals both plateau at around 80 seconds, indicating the process chamber is clean. The steady-state DC bias attained is more negative in comparison to the silicon dioxide film deposited using the TEOS method (FIG. 2). FIG. 4 relates to cleaning after deposition of a dielectric film stack at 125° C. using an anodised aluminium showerhead. The stack comprises layers of a 1.05 micron thick silicon nitride film and 0.6 micron thick layers of silicon dioxide deposited using the TEOS method. DC bias 100 and FTIR 102 signals both plateau at around 110 seconds, indicating the process chamber is clean.

| Sample No | Film type | Thickness (μm) | Showerhead type | Deposition temperature (° C.) | Time to endpoint (sec) |
|---|---|---|---|---|---|
| FIG. 2 | SiO2 (TEOS) | 2.7 | Al | 125 | 300 |

-continued

| Sample No | Film type | Thickness (μm) | Showerhead type | Deposition temperature (° C.) | Time to endpoint (sec) |
|---|---|---|---|---|---|
| FIG. 3 | SiO2 (TEOS) | 0.6 | Al | 125 | 120 |
| FIG. 4 | SiN | 0.2 | Al | 125 | 80 |
| FIG. 5 | SiN + SiO2 | 1.05 + 0.6 | Al | 125 | 120 |
| FIG. 6 | SiO2 (TEOS) | 0.5 | Al | 350 | 150 |
| FIG. 7 | SiN + SiO2 | 1.05 + 0.6 | Anodized Al | 125 | 110 |

Figure 5A:
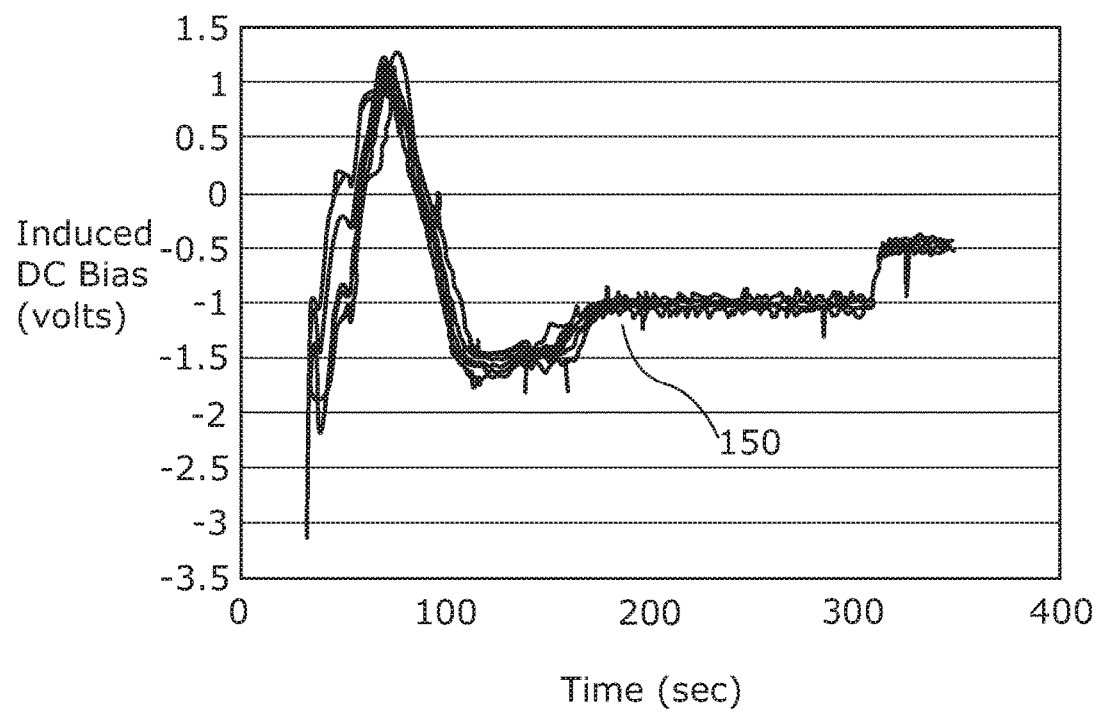
FIGS. 5A and 5B respectively show DC bias and FTIR signal on an anodised aluminium showerhead as a function of chamber clean time for a 10 wafer repeatability run.
Figure 5B:
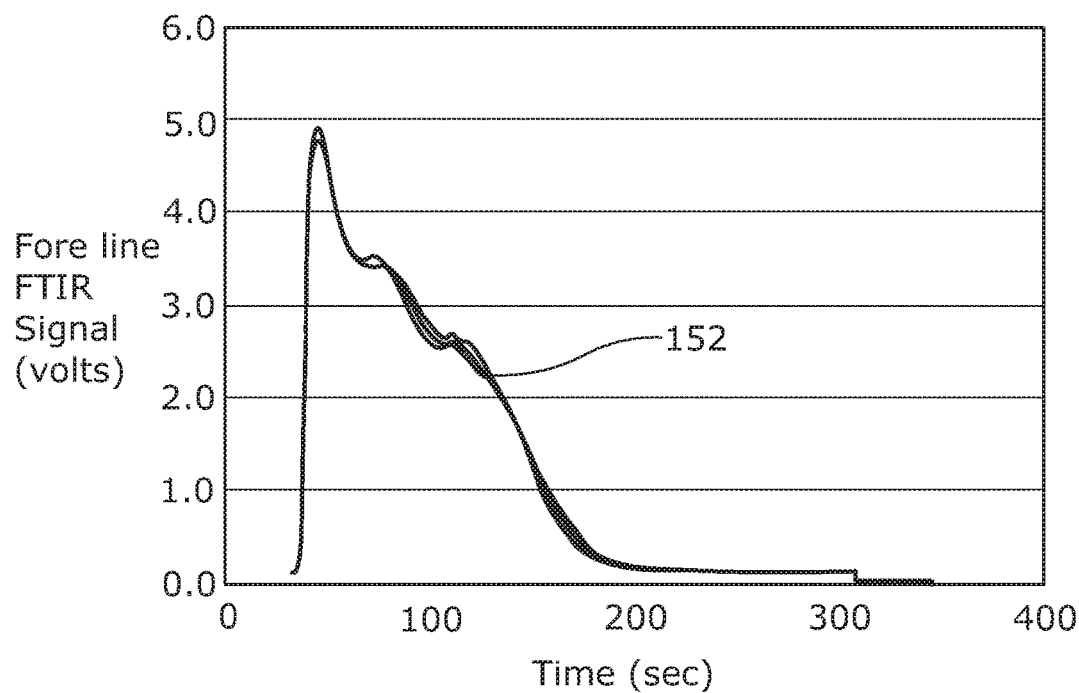

In practice, the reproducibility of end-point detection is important in order to maintain a stable operative regime. Experiments were performed over a 10 wafer repeatability run with two wafers between cleans after deposition of dielectric stacks. Dielectric stacks comprised 1.05 micron thick silicon nitride and 0.6 micron thick silicon dioxide layers deposited at 125° C. Silicon dioxide layers were deposited using the TEOS method. FIG. 5(a) shows the DC bias signals 150 obtained during cleaning. FIG. 5(b) shows the FTIR signals 152 obtained during cleaning. It can be seen that there is a high degree of repeatability. In particular, the DC bias and FTIR signals both reproducibly plateau at around 240 seconds. This indicates that monitoring DC bias on a process chamber component during cleaning using radicals produced in a remote plasma source is a reliable way of detecting a cleaning end-point.

The results summarised in Table 1 and shown in FIGS. 2-5 indicate that there is a correlation between the induced DC bias on the showerhead and the foreline FTIR signal. In fact, the FTIR signal lags behind the DC bias signal slightly. This is believed to be due to the different sampling methods. A DC bias sampling is performed in the chamber in which cleaning is taking place in 'real time'. In contrast, the FTIR monitoring is performed in the foreline a distance outside of the process chamber. It is possible that process information might be deduced from the relatively responsive DC bias signal obtained before the end-point.

It is observed that the time to cleaning end-points obtained are not directly proportional to the film thickness. This is not unexpected, because other factors are believed to play a part in determining the time to end-point. Relevant factors include the type of film and the process used to deposit the film. Different processes and film types deposit differently in the chamber, resulting in a non-uniform coating to be removed. For example, one silicon nitride process may deposit a thicker film at the edge of the showerhead compared to another silicon nitride deposition process. This would result in a different time to end-point. Clean process development has shown that the etch rate of the deposited material is slightly lower at the edge of the showerhead compared to the centre. Therefore, thicker films at the edge of the showerhead will take longer to clean than thicker films at the centre of the showerhead. The DC bias signals associated with the different films differ from one another in terms of absolute values and general shapes. This can be attributed to different film types having different dielectric properties. It is believed that this changes the overall chamber impedance, resulting is small differences in the induced DC bias. In addition to this, it is believed that different processes deposit dielectric films in different areas of the chamber, resulting in small changes to the overall chamber impedance. It is believed that subtle changes in chamber impedance are responsible for small differences in the induced DC bias on the showerhead.

Although the showerhead is a particularly convenient component for monitoring induced DC bias in the process chamber, other components of the process chamber on which DC bias can be induced might be monitored. For example, DC bias might be monitored on other components on a gas inlet system, an electrically isolated portion of a wall of the chamber, the platen, or the pumping gallery of the chamber.

What is claimed is:

1. A method of cleaning a chamber of a plasma processing device, comprising the steps of:
    creating a plasma within a remote plasma source which is separated from the chamber, the plasma comprising radicals and ions;
    cleaning the chamber with the radicals created in the remote plasma source by allowing the radicals to enter the chamber from the remote plasma source while preventing a majority of the ions created in the remote plasma source from entering the chamber and without producing charged particles anywhere in the chamber;
    detecting a DC bias developed on a component of the chamber during the cleaning; and
    using the detected DC bias to determine an end-point of the cleaning and, on determination of the end-point, to stop the cleaning.

2. A method according to claim 1 in which the component is a component of a gas inlet system.

3. A method according to claim 2 in which the component acts as a conduit for radicals produced in the remote plasma source.

4. A method according to claim 3 in which the component is a showerhead.

5. A method according to claim 1 in which the component is a substrate support disposed in the chamber, an electrically isolated portion of a wall of the chamber, or a pumping gallery.

6. A method according to claim 1 in which the plasma processing device is a PECVD device.

7. A method according to claim 1 in which the end-point is determined by detecting that the DC bias has attained a steady-state.

8. A method according to claim 1 in which the cleaning is performed using F radicals.

9. A method according to claim 8 in which the plasma created within the remote plasma source uses $NF_3$ as a precursor.

10. A method according to claim 1 in which the chamber is cleaned after one or more dielectric films have been deposited in the chamber.

11. A method according to claim 10 in which each said at least one or more of the dielectric films is a film of a silicon containing dielectric material.

12. A method according to claim 11 in which the silicon containing dielectric material is silicon dioxide or silicon nitride.

13. A method according to claim 1 in which the cleaning of the chamber and the detecting of the DC bias are carried out while the remote plasma source is electrically floating with respect to the chamber.

14. A method of cleaning a plasma processing device, comprising the steps of:
    creating a plasma within a remote plasma source which is separated from a process section of the device including a process chamber having a main body delimiting a process space in which plasma processing is carried out by the device and a conduit leading from the process space to a pump for exhausting gas from the process space, the plasma comprising radicals and ions;

cleaning the process chamber with the radicals created in the remote plasma source by allowing the radicals to enter the process chamber from the remote plasma source while preventing a majority of the ions created in the remote plasma source from entering the process chamber and without producing charged particles anywhere in the process chamber;

detecting a DC bias developed on a component of the process section during the cleaning; and using the detected DC bias to determine an end-point of the cleaning and, on determination of the end-point, to stop the cleaning.

15. A method according to claim 14 in which the component is a component of a gas inlet system connected to the main body of the process chamber.

16. A method according to claim 14 in which the component is a substrate support disposed in the main body of the process chamber, an electrically isolated portion of a wall of the main body of the process chamber, or a pumping gallery constituting the conduit.

17. A method of cleaning a process chamber of a plasma processing device, comprising the steps of:

creating a plasma within a remote plasma source which is separated from the process chamber, the plasma comprising radicals and ions;

cleaning the process chamber with the radicals created in the remote plasma source by allowing the radicals to enter the process chamber from the remote plasma source while preventing a majority of the ions created in the remote plasma source from entering the process chamber;

detecting a DC bias developed on a component of the plasma processing device during the cleaning; and using the detected DC bias to determine an end-point of the cleaning and, on determination of the end-point, to stop the cleaning, wherein the plasma is created by introducing source gas into the remote plasma source and exciting the source gas, and the cleaning of the process chamber and the detecting of the DC bias are carried out without exciting gas to produce a plasma anywhere else in the plasma processing device but in the remote plasma source.

18. A method according to claim 17 in which the component is a component of a gas inlet system.

19. A method according to claim 18 in which the component acts as a conduit for radicals produced in the remote plasma source.

20. A method according to claim 19 in which the component is a showerhead.

21. A method according to claim 17 in which the component is a substrate support, an electrically isolated portion of a wall of the process chamber, or a pumping gallery.

* * * * *